(12) United States Patent
Wang

(10) Patent No.: US 7,498,861 B2
(45) Date of Patent: Mar. 3, 2009

(54) MIXER

(75) Inventor: Po-Chih Wang, Kaohsiung (TW)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 11/730,908

(22) Filed: Apr. 4, 2007

(65) Prior Publication Data

US 2007/0229140 A1    Oct. 4, 2007

(30) Foreign Application Priority Data

Apr. 4, 2006    (TW)    ............................... 95112043 A

(51) Int. Cl.
*G06G 7/12* (2006.01)
(52) U.S. Cl. .................. 327/359; 327/355; 455/333
(58) Field of Classification Search ......... 327/355–359; 455/326, 333
See application file for complete search history.

(56) References Cited

U.S. PATENT DOCUMENTS 6,094,084 A * 7/2000 Abou-Allam et al. ....... 327/359
6,865,382 B2 * 3/2005 Behzad ....................... 455/323
7,292,102 B2 * 11/2007 Lee et al. .................... 330/254

OTHER PUBLICATIONS

Klumperink et al., IEEE Journal of Solid-State Circuits, vol. 39, No. 8, (Aug. 2004), pp. 1231-1240.
Tiebout et al., Solid-States Circuits Conference, 2003 (Sep. 16-18, 2003), ESSCIRC '03. Proceedings of the 29th European, pp. 577-580.
Terrovis et al., IEEE Journal of Solid-State Circuits, vol. 34, No. 6, (Jun. 1999), pp. 772-783.
Steyaert et al., IEEE Journal of Solid-State Circuits, vol. 35, No. 12, (Dec. 2000), pp. 1895-1907.

* cited by examiner

*Primary Examiner*—Dinh T. Le
(74) *Attorney, Agent, or Firm*—Birch, Stewart, Kolasch & Birch, LLP

(57) ABSTRACT

A mixer includes first to fourth NMOS transistors, first and second switches, first to fourth current sources, a first impedance and a second impedance. The first NMOS transistor has a drain coupled to the first impedance and a drain of the third NMOS transistor, and a gate for receiving a positive input signal. The second NMOS transistor has a drain coupled to the second impedance and a drain of the fourth NMOS transistor, and a gate for receiving a negative input signal. Gates of the third and fourth NMOS transistors respectively receive the negative and positive input signals. The first switch is coupled between sources of the first and second NMOS transistors. The second switch is coupled between sources of the third and fourth NMOS transistors. The first to fourth current sources maintain constant currents flowing through the sources of the first to fourth NMOS transistors, respectively.

10 Claims, 5 Drawing Sheets

MIXER

This application claims the benefit of Taiwan application Serial No. 95112043, filed Apr. 4, 2006, the subject matter of which is incorporated herein by reference.

BACKGROUND OF THE INVENTION

1. Field of the Invention

The invention relates in general to a mixer, and more particularly to a mixer capable of providing a lower operation voltage.

2. Description of the Related Art

A mixer converts a frequency of an input signal into another frequency and may be used in, for example, a down-sampling procedure or an up-sampling procedure. FIG. 1 (Prior Art) is a circuit diagram showing a conventional mixer 100. Referring to FIG. 1, the mixer 100 includes transistors Q1, Q2, Q3, Q4, Q5 and Q6 and a current source Cs1. The mixer 100 must have a higher operation voltage in order to have the high gain, the good linearity and the low noise.

With the progress of the CMOS manufacturing technology and the coming of the system-on-chip (SOC) age, the operation voltage of the analog circuit also has to be reduced.

In the mixer 100 of FIG. 1, when the provided operation voltage is decreased, voltages at the drains of the transistors Q6 and Q3 are also decreased so that the transistors Q3 and Q6 cannot work in the saturation region and the overall behavior of the circuit is influenced. In order to reduce the voltage drop, the current source Cs1 is usually removed, but this method increases a common mode gain.

SUMMARY OF THE INVENTION

The invention is directed to a mixer having an operation voltage, which may be reduced with the requirement of the manufacturing process.

According to the present invention, a mixer is provided. The mixer includes first to fourth NMOS transistors, a first switch, a second switch, first to fourth current sources, a first impedance and a second impedance. The first NMOS transistor has a drain coupled to the first impedance and a gate for receiving a positive input signal. The first impedance receives a positive output current. The second NMOS transistor has a drain coupled to the second impedance and a gate for receiving a negative input signal. The second impedance receives a negative output current. The third NMOS transistor has a drain coupled to the drain of the first NMOS transistor and a gate for receiving the negative input signal. The fourth NMOS transistor has a drain coupled to the drain of the second NMOS transistor and a gate for receiving the positive input signal. The first switch is coupled to and between a source of the first NMOS transistor and a source of the second NMOS transistor, and the first switch is controlled by a positive local oscillation signal. The second switch is coupled to and between a source of the third NMOS transistor and a source of the fourth NMOS transistor, and the second switch is controlled by a negative local oscillation signal. The negative local oscillation signal and the positive local oscillation signal have reversed phases. The first current source is coupled to the source of the first NMOS transistor and provides a bias current. The second current source is coupled to the source of the second NMOS transistor and provides the bias current. The third current source is coupled to the source of the third NMOS transistor and provides the bias current. The fourth current source is coupled to the source of the fourth NMOS transistor and provides the bias current.

The invention will become apparent from the following detailed description of the preferred but non-limiting embodiments. The following description is made with reference to the accompanying drawings.

DETAILED DESCRIPTION OF THE INVENTION

Figure 2:
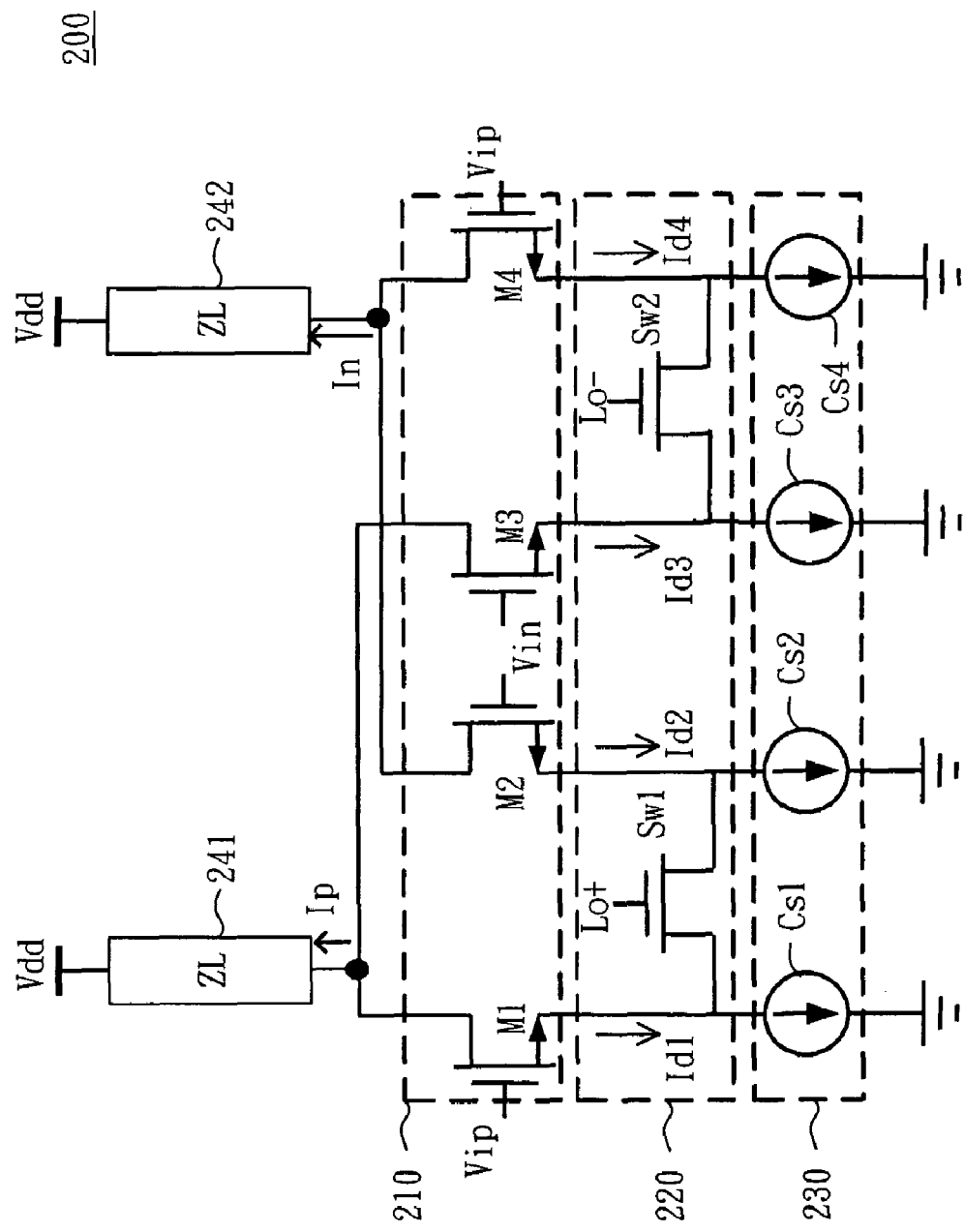
FIG. 2 is a circuit diagram showing a mixer according to a preferred embodiment of the invention.

FIG. 2 is a circuit diagram showing a mixer 200 according to a preferred embodiment of the invention. Referring to FIG. 2, the mixer 200 includes a transconductance gain stage 210, a switching stage 220, a current source set 230, a first impedance 241 and a second impedance 242.

The transconductance gain stage 210 includes an NMOS transistor M1, an NMOS transistor M2, an NMOS transistor M3 and an NMOS transistor M4. The NMOS transistor M1 has a drain coupled to the first impedance 241 and a gate for receiving a positive input signal Vip. The NMOS transistor M2 has a drain coupled to the second impedance 242 and a gate for receiving a negative input signal Vin. The NMOS transistor M3 has a drain coupled to the drain of the NMOS transistor M1 and a gate for receiving the negative input signal Vin. The NMOS transistor M4 has a gate for receiving the positive input signal Vip and a drain coupled to the drain of the NMOS transistor M2. The first impedance 241 receives a positive output current Ip to generate a radio frequency signal, and the second impedance 242 receives a negative output current In to generate the radio frequency signal.

The switching stage 220 includes a first switch Sw1 and a second switch Sw2. The first switch Sw1 is coupled to and between a source of the NMOS transistor M1 and a source of the NMOS transistor M2. The first switch Sw1 is controlled by a positive local oscillation signal Lo+ to turn on and off. The second switch Sw2 is coupled to and between a source of the NMOS transistor M3 and a source of the NMOS transistor M4. The second switch is correspondingly controlled by a negative local oscillation signal Lo− to turn on and off, and the negative local oscillation signal Lo− and the positive local oscillation signal Lo+ have reversed phases.

The current source set 230 includes current sources Cs1, Cs2, Cs3 and Cs4. The current source Cs1 is coupled to the source of the NMOS transistor M1 and provides a first bias current. The current source Cs2 is coupled to the source of the NMOS transistor M2 and provides a second bias current. The current source Cs3 is coupled to the source of the NMOS transistor M3 and provides a third bias current. The current source Cs4 is coupled to the source of the NMOS transistor M4 and provides a fourth bias current. The current sources Cs1, Cs2, Cs3 and Cs4 may be implemented by MOS transistors.

The mixing principle of the mixer 200 will be described in the following. When the first switch Sw1 turns on due to the positive local oscillation signal Lo+ and the second switch Sw2 turns off due to the negative local oscillation signal Lo−, the signals Vin and Vip cannot be amplified because the sources of the NMOS transistors M3 and M4 are coupled to the current sources Cs3 and Cs4. At this time, the NMOS transistors M1 and M2 form a differential pair. If the drain current of the NMOS transistor M1 is Id1, the drain current of the NMOS transistor M2 is Id2, the drain current of the NMOS transistor M3 is Id3, and the drain current of the NMOS transistor M4 is Id4, the following equations may be obtained:

$$Ip=-(Id1+Id3);\ and$$

$$In=-(Id2+Id4).$$

Herein, if the output current is defined as Iout, the value of Iout is as follows:

$$Iout=Ip-In;$$
$$=Id2-Id1;$$
$$=Gm*(Vip-Vin);$$

wherein Gm is the transconductance of the NMOS transistors M1, M2, M3 and M4.

When the first switch Sw1 turns off due to the positive local oscillation signal Lo+ and the second switch Sw2 turns on due to the negative local oscillation signal Lo−, the signals Vin and Vip cannot be amplified because the sources of the NMOS transistors M1 and M2 are coupled to the current sources Cs1 and Cs2. At this time, the NMOS transistors M3 and M4 form a differential pair. The following equations may be obtained according to the above-mentioned derivation:

$$Iout=-Gm*(Vip-Vin).$$

The values of the impedances 241 and 242 may be ZL, and the output voltage Vout is defined as follows:

$$Vout=Iout*ZL.$$

Thus, the mixing effect may be achieved when the transconductance gain stage 210 is switched by the switching stage 220.

Figure 3:
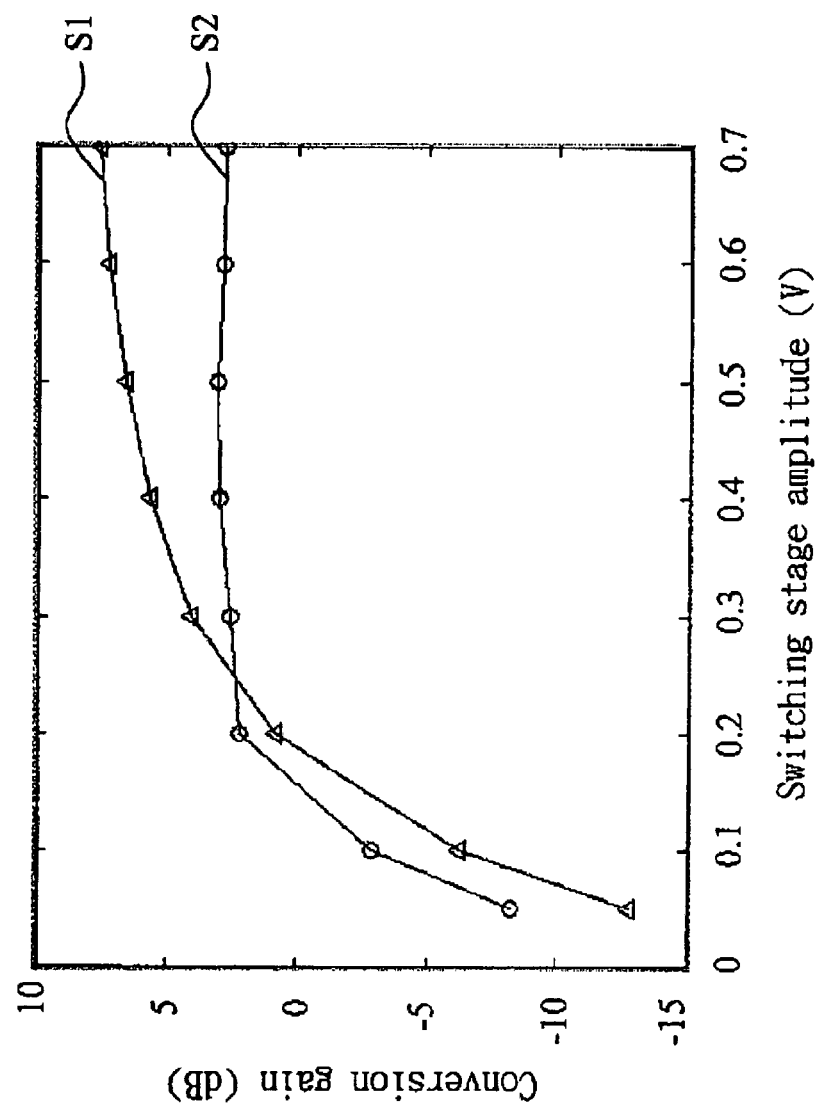
FIG. 3 shows associated curves of a conversion gain and a switching stage amplitude of the conventional mixer and the mixer according to the embodiment of the invention.

FIG. 3 shows associated curves of conversion gain and switching stage amplitude of the conventional mixer and the mixer according to an embodiment of the invention. Curve S1 shows the relationship between the conversion gain and the switching stage amplitude in the conventional mixer 100. Curve S2 shows the relationship between the conversion gain and the switching stage amplitude in the mixer 200 according to the embodiment of the invention. As shown in this drawing, the operation voltage of the conventional mixer of FIG. 1 is 1 volt, and the operation voltage of the mixer 200 is 0.9 volts.

As shown in FIG. 2, because the paths of the main input signals, such as the positive input signal Vip and the negative input signal Vin, convert the input signal into a current signal through the transconductance gain stage 210 in the mixer 200, the first impedance 241 and the second impedance 242 receive the currents Ip and In. The input amplitudes Lo+ and Lo− of the switching stage 220 only influence the on/off states of the first switch Sw1 and the second switch Sw2, and do not directly influence the operation of the transconductance gain stage 210. So, as shown in curve S2, the input amplitude of the switching stage greater than 0.2 volts cannot influence the conversion gain.

Figure 1:
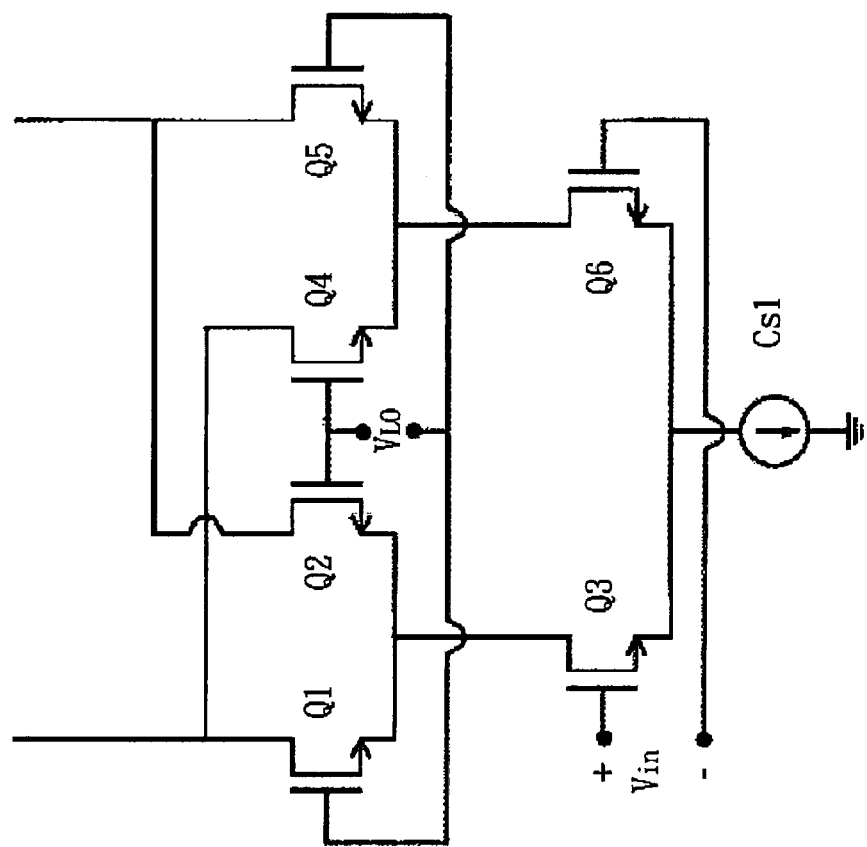
FIG. 1 (Prior Art) is a circuit diagram showing a conventional mixer.

As shown in FIG. 1, the main signal path of the conventional mixer 100 is converted into a current in its transconductance gain stage, and then the current is outputted through the switching stage, which is composed of Q1, Q2, Q3 and Q4, so that the conversion gain is directly influenced by the input signal VLo of the switching stage and the result of curve S1 in FIG. 3 is obtained. As shown in curve S1, the conversion gain of the conventional mixer is obviously influenced by the input amplitude of the switching stage so that the linearity is reduced.

In the mixer 200, the path of the main input signal does not pass through the switching stage 220, so the conversion gain thereof does not relate to the input amplitude of the switching stage. Comparing curve S1 with curve S2, the phenomenon represented by the curve S1 is that the conversion gain cannot be easily influenced by the input amplitude of the switching stage so that curve S1 is held horizontal and the conversion gain is considerably stable.

Figure 4A:
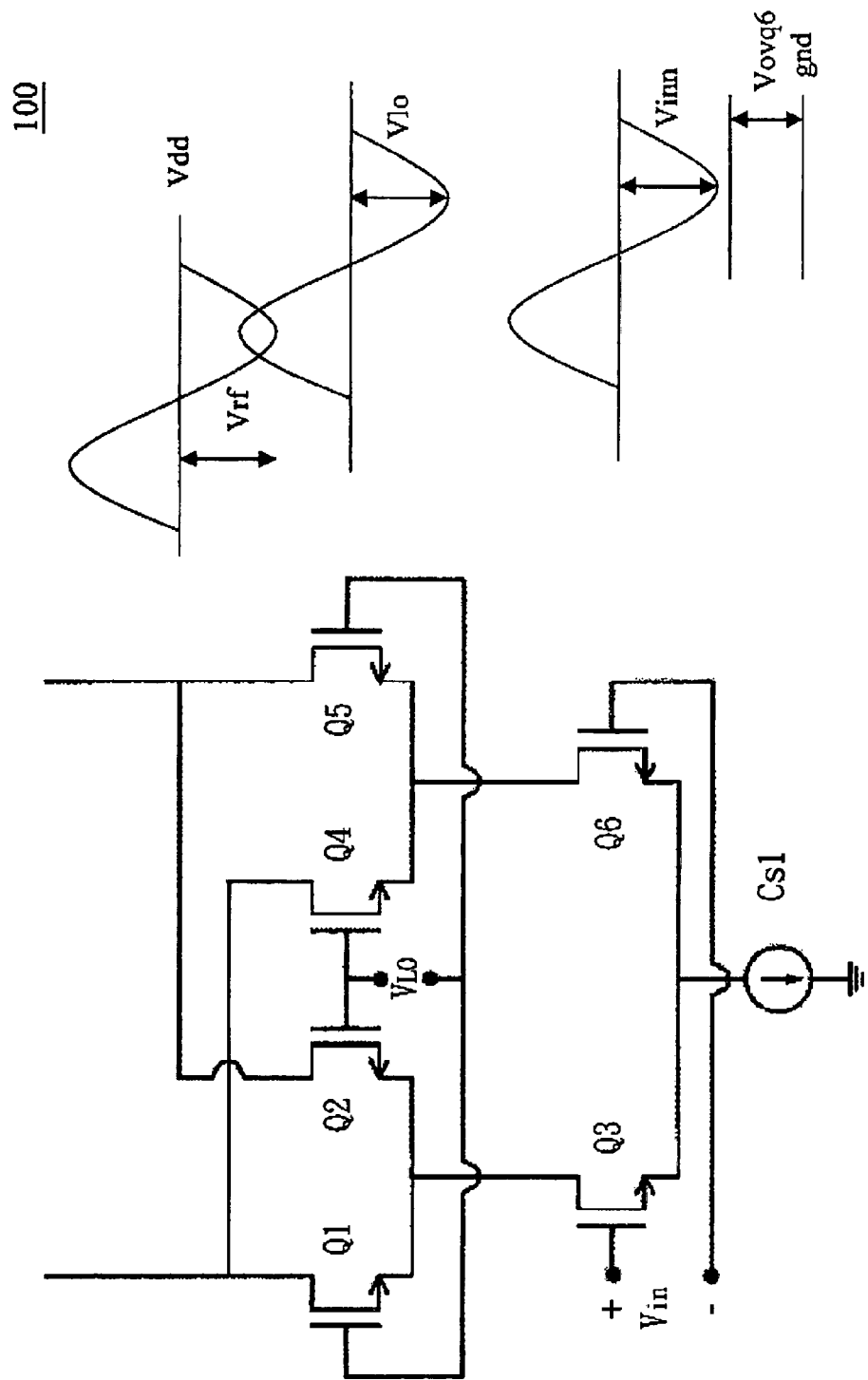
FIG. 4A (Prior Art) is a schematic illustration showing an associated operation voltage of the conventional mixer.

FIG. 4A is a schematic illustration showing an associated operation voltage of the conventional mixer. Assume the radio frequency signal of the drain of the NMOS transistor Q5 takes the operation voltage Vdd as a median, and has the amplitude of the voltage Vrf. The amplitude of the input signal of the gate of the NMOS transistor Q5 is the voltage Vlo. The amplitude of the input signal of the gate of the NMOS transistor Q6 is the voltage Vinn. Considering the minimum operation voltage (overdrive voltage) Vovq5 of the NMOS transistor Q5, the minimum operation voltage Vovq6 of the NMOS transistor Q6 and the minimum operation voltage Vovcs of the current source Cs1, the following equation may be obtained:

$$Vdd>=Vinn+Vlo+Vrf+Vovq5+Vovq6+Vovcs. \quad (1)$$

Figure 4B:
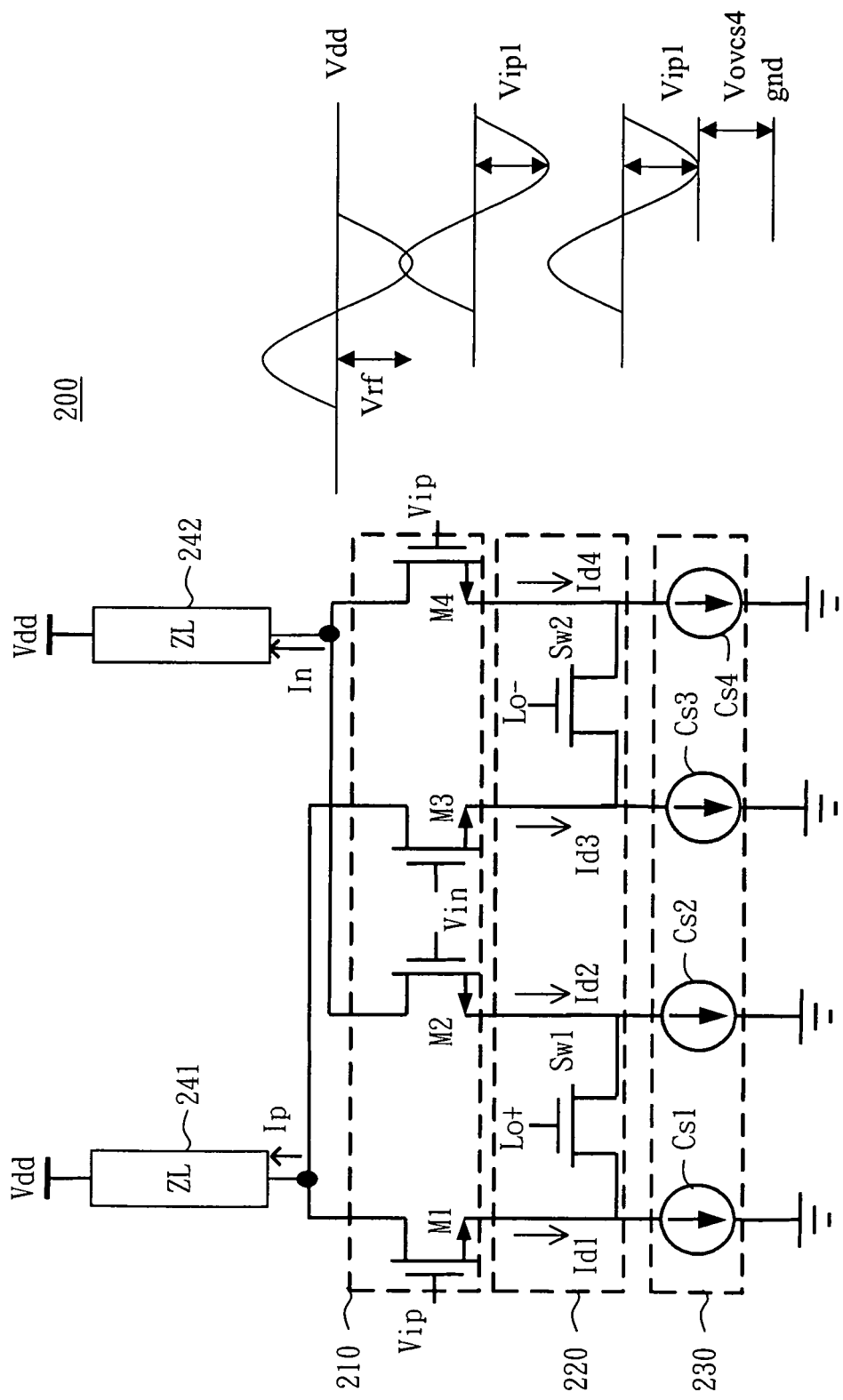
FIG. 4B is a schematic illustration showing an associated operation voltage of the mixer according to the embodiment of the invention.

FIG. 4B is a schematic illustration showing an associated operation voltage of the mixer according to an embodiment of the invention. In FIG. 4B, the current paths of the NMOS transistor M4 and the current source Cs4 serve as an example. The radio frequency signal generated at the drain of the NMOS transistor M4 takes the operation voltage Vdd as the median, and has the amplitude of the voltage Vrf. The positive input signal Vip received by the NMOS transistor M4 has the amplitude Vip1. Considering the lowest operation voltage Vovm4 of the NMOS transistor M4 and the lowest operation voltage Vovcs4 of the current source Cs4, the following equation may be obtained:

$$Vdd>=2Vip1+Vrf+Vovm4+Vovcs4. \quad (2)$$

Comparing Equation (1) with Equation (2) and assuming the minimum operation voltage of the NMOS transistor in the switching stage of the conventional mixer is Vov, and the amplitude Vip1 is equal to the amplitude Vinn, the following equation may be obtained:

$$Vip1<Vlo+Vov. \quad (3)$$

Accordingly, the mixer according to the embodiment of the invention has a lower operation voltage Vdd than that of the conventional mixer.

Similarly, according to the derivation of Equation (2) with reference to the current path composed of the NMOS transistor M1 and the current source Cs1, it is obtained that the operation voltage Vdd has to be greater than or equal to a sum of two times of the voltage amplitude Vip1 of the positive input signal Vip, the voltage amplitude Vrf of the radio frequency signal, the lowest operation voltage of the NMOS transistor M1 and the lowest operation voltage of the current source Cs1.

Referring to the current path composed of the NMOS transistor M2 and the current source Cs2, the operation voltage Vdd is greater than or equal to a sum of two times of the voltage amplitude Vin1 of the negative input signal Vin, the voltage amplitude Vrf of the radio frequency signal, the lowest operation voltage of the NMOS transistor M2 and the lowest operation voltage of the current source Cs2.

Referring to the current path composed of the NMOS transistor M3 and the current source Cs3, the operation voltage Vdd is greater than or equal to a sum of two times of the voltage amplitude Vin1 of the negative input signal Vin, the voltage amplitude Vrf of the radio frequency signal, the lowest operation voltage of the NMOS transistor M3 and the lowest operation voltage of the current source Cs3.

Compared with the conventional mixer 100, the operation voltage in the mixer 200 according to the embodiment of the invention is not consumed by the voltage drop of the switching stage. So, the mixer according to the embodiment of the invention can deal with the trend of the decreasing operation voltage without influencing the behavior of the overall circuit.

In the mixer according to the embodiment of the invention, the provided operation voltage cannot be consumed by the voltage drop of the switching stage, so the lower operation voltage can be used in conjunction with the manufacturing technology. In addition, the mixer according to the embodiment of the invention further has a feature that the conversion gain thereof does not greatly change with the change of the input amplitude of the switching stage.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mixer, for converting input signals to voltage signals of other frequencies, comprising:
    a first impedance for receiving a positive output current and generating a first voltage signal at a first node, wherein the first node is coupled to a terminal of the first impedance;
    a second impedance for receiving a negative output current and generating a second voltage signal at a second node, wherein the second node is coupled to a terminal of the second impedance;
    a first NMOS transistor having a drain coupled to the first node and a gate for receiving a positive input signal;
    a second NMOS transistor having a drain coupled to the second node and a gate for receiving a negative input signal;
    a third NMOS transistor having a drain coupled to the drain of the first NMOS transistor and a gate for receiving the negative input signal;
    a fourth NMOS transistor having a drain coupled to the drain of the second NMOS transistor and a gate for receiving the positive input signal;
    a first switch having a first terminal coupled to a source of the first NMOS transistor and a second terminal coupled to a source of the second NMOS transistor, wherein the first switch is controlled by a positive local oscillation signal;
    a second switch having a first terminal coupled to a source of the third NMOS transistor and a second terminal coupled to a source of the fourth NMOS transistor, wherein the second switch is controlled by a negative local oscillation signal;
    a first current source, which is coupled to the source of the first NMOS transistor and provides a first bias current;
    a second current source, which is coupled to the source of the second NMOS transistor and provides a second bias current;
    a third current source, which is coupled to the source of the third NMOS transistor and provides a third bias current; and
    a fourth current source, which is coupled to the source of the fourth NMOS transistor and provides a fourth bias current.

2. The mixer according to claim 1, wherein the negative local oscillation signal and the positive local oscillation signal have reversed phases.

3. The mixer according to claim 1, wherein the first switch is a NMOS transistor having a gate for receiving the positive local oscillation signal.

4. The mixer according to claim 1, wherein the second switch is a NMOS transistor having a gate for receiving the negative local oscillation signal.

5. The mixer according to claim 1, wherein the first current source, the second current source, the third current source and the fourth current source are composed of MOS transistors.

6. The mixer according to claim 1, wherein an operation voltage applied to the mixer is greater than or equal to a sum of two times of a voltage amplitude of the positive input signal, a voltage amplitude of the first voltage signal, a lowest operation voltage applied to the first NMOS transistor and a lowest operation voltage applied to the first current source.

7. The mixer according to claim 1, wherein an operation voltage applied to the mixer is greater than or equal to a sum of two times of a voltage amplitude of the negative input signal, a voltage amplitude of the second voltage signal, a lowest operation voltage applied to the second NMOS transistor and a lowest operation voltage applied to the second current source.

8. The mixer according to claim 1, wherein an operation voltage applied to the mixer is greater than or equal to a sum of two times of a voltage amplitude of the negative input signal, a voltage amplitude of the first or second voltage signal, a lowest operation voltage applied to the third NMOS transistor and a lowest operation voltage applied to the third current source.

9. The mixer according to claim 1, wherein an operation voltage applied to the mixer is greater than or equal to a sum of two times of a voltage amplitude of the positive input signal, a voltage amplitude of the first or second voltage signal, a lowest operation voltage applied to the fourth NMOS transistor and a lowest operation voltage applied to the fourth current source.

10. The mixer according to claim 1, wherein the impedance of the first impedance and the second impedance are substantially equal.

* * * * *